(12) United States Patent
Hurley

(10) Patent No.: US 6,790,721 B2
(45) Date of Patent: *Sep. 14, 2004

(54) METAL LOCAL INTERCONNECT SELF-ALIGNED SOURCE FLASH CELL

(75) Inventor: Kelly T. Hurley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/905,633

(22) Filed: Jul. 13, 2001

(65) Prior Publication Data

US 2003/0011023 A1 Jan. 16, 2003

(51) Int. Cl.[7] .......................................... H01L 21/8238
(52) U.S. Cl. ....................................... 438/201; 438/257
(58) Field of Search ............................... 438/201, 257, 438/266, 627, 643, 653, 626; 257/315, 316, 319

(56) References Cited

U.S. PATENT DOCUMENTS

| | | | |
|---|---|---|---|
| 5,210,047 A | 5/1993 | Woo et al. | 437/43 |
| 5,731,242 A | 3/1998 | Parat et al. | 438/586 |
| 5,994,733 A * | 11/1999 | Nishioka et al. | 257/316 |
| 6,080,624 A | 6/2000 | Kamiya et al. | 438/257 |
| 6,188,115 B1 * | 2/2001 | Kamitani | 257/412 |
| 6,271,087 B1 | 8/2001 | Kinoshita et al. | 438/258 |
| 2001/0024857 A1 * | 9/2001 | Parat et al. | 438/259 |
| 2002/0039821 A1 * | 4/2002 | Wolstenholme | 438/257 |
| 2003/0013253 A1 * | 1/2003 | Hurley | 438/257 |
| 2003/0027390 A1 * | 2/2003 | Wolstenholme | 438/257 |
| 2003/0064563 A1 * | 4/2003 | Wolstenholme | 438/257 |
| 2003/0151080 A1 * | 8/2003 | Hurley et al. | 257/296 |
| 2003/0206447 A1 * | 11/2003 | Tuan et al. | 365/185.33 |

OTHER PUBLICATIONS

H. Watanabe et al., IEDM, 98 pp. 975–978.*
"Novel 0.44 $\mu m^2$ Ti–Salicide STI Cell Technology for High Density NOR Flash Memories and High Performance Embedded Application", H. Watanabe et al., IEDM, 98 pp. 975–978.
"A 130–$mm^2$, 256–Mbit NAND Flash with Shallow Trench Isolation Technology", Kenichi Imamiya et al., IEEE Journal of Solid–State Circuits, vol. 34, No. 11, Nov. 1999.

* cited by examiner

Primary Examiner—W. David Coleman
Assistant Examiner—Khiem Nguyen

(57) ABSTRACT

A flash memory cell comprising a series of floating gate devices being connected to one-another through their source electrodes, which are self-aligned to their respective gate electrodes, where a local tungsten interconnect makes a substantially continuous connection to the self-aligned sources. The flash memory cell is formed by forming floating gate devices having their source electrodes connected together by a conductively doped active area, forming a nitride barrier layer overlying each transistor gate, forming a planarized insulation layer over the nitride barrier layer, removing portions of the planarized insulation layer while using the nitride barrier layer to self-align an interconnect via to the source electrodes, forming a tungsten-based interconnect into the interconnect via, the tungsten-based interconnect running a major length of the source electrodes being connected together and making contact therebetween, and forming a tungsten-based drain plug for each floating gate device.

11 Claims, 6 Drawing Sheets

METAL LOCAL INTERCONNECT SELF-ALIGNED SOURCE FLASH CELL

FIELD OF THE INVENTION

This invention relates to semiconductor fabrication processing and, more particularly, to a fabrication method for forming storage cells in semiconductor devices, such as non-volatile flash memory devices.

BACKGROUND OF THE INVENTION

Non-volatile semiconductor memory devices are currently used extensively through the electronics industry. One type of non-volatile semiconductor memory devices employs the use of floating gate memory cells that are able to retain and transfer charge through a variety of mechanisms which include avalanche injection, channel injection, tunneling, etc. A flash memory device is such a semiconductor device that utilizes a floating gate memory cell. As is the case with most semiconductors being fabricated, the industry continues to push for smaller devices that contain a larger number of memory cells than each previous generation. This is also the case for the flash memory device.

In a flash memory device, fabrication of the components that make up the floating gate transistor determines the ability of the device to be programmed and retain an electrical charge as well as the ability of the device to be reprogrammed by being erased (or the removal of the electrical charge). Flash memory cells comprising floating gate transistors are laid out in such a manner that a plurality of cells forms a memory array.

A device in the programmed state, i.e., charge stored on the floating gate, represents a stored "0" and a device in the non-programmed state, i.e., no charge stored on the floating gate, represents a stored "1." Reading a device in the programmed state will cause the device to conduct heavily, while reading a device in the non-programmed state the device will not conduct. Each floating gate transistor in the array has a common source line and the common source line requires sophisticated fabrication techniques.

The present invention provides a floating gate device structure and method to fabricate a low resistant local interconnect self-aligned source that will provide enhanced operation of a flash memory cell device.

SUMMARY OF THE INVENTION

Exemplary implementations of the present invention comprise a flash memory device and processes therefor.

A first exemplary implementation of the present invention includes a flash memory device comprising a series of floating gate devices each having an implanted source electrode self-aligned to a respective gate electrode, the implanted source electrodes connected together by a conductively doped active area, and a metal interconnect running a major length of source electrodes that are serially connect by the self-aligned source, the metal interconnect making substantially continuous contact therebetween. The metal interconnect may comprise a tungsten-based metal, such as tungsten or tungsten/titanium.

A second exemplary implementation of the present invention includes process steps for forming a flash memory device on a semiconductor assembly.

A series of floating gate devices having their source electrodes connected together by a conductively doped active area is formed. The source electrodes of each device are self-aligned to their respective transistor gates of each said floating gate device. Then a nitride barrier layer is formed such that it overlies each transistor gate. Next, a planarized insulation layer is formed over said nitride barrier layer. Portions of the planarized insulation layer are removed while using the nitride barrier layer to self-align an interconnect via to underlying source electrodes. The nitride barrier layer is etched away, such as with an anisotropic dry etch, to expose the underlying self-aligned sources. A metal local interconnect is formed into the interconnect via. The metal interconnect runs the major length of the source electrodes, while making contact therebetween. It is optional to simultaneously form metal drain plugs for each floating gate device and self-aligning each metal drain plug to an underlying drain electrode. The metal interconnect and the metal drain plug may be formed from a tungsten-based metal, such as tungsten or tungsten/titanium.

DETAILED DESCRIPTION OF THE INVENTION

Exemplary implementations of the present invention directed to processes for fabricating a floating gate memory device are depicted in FIGS. 1–10.

Figure 1:
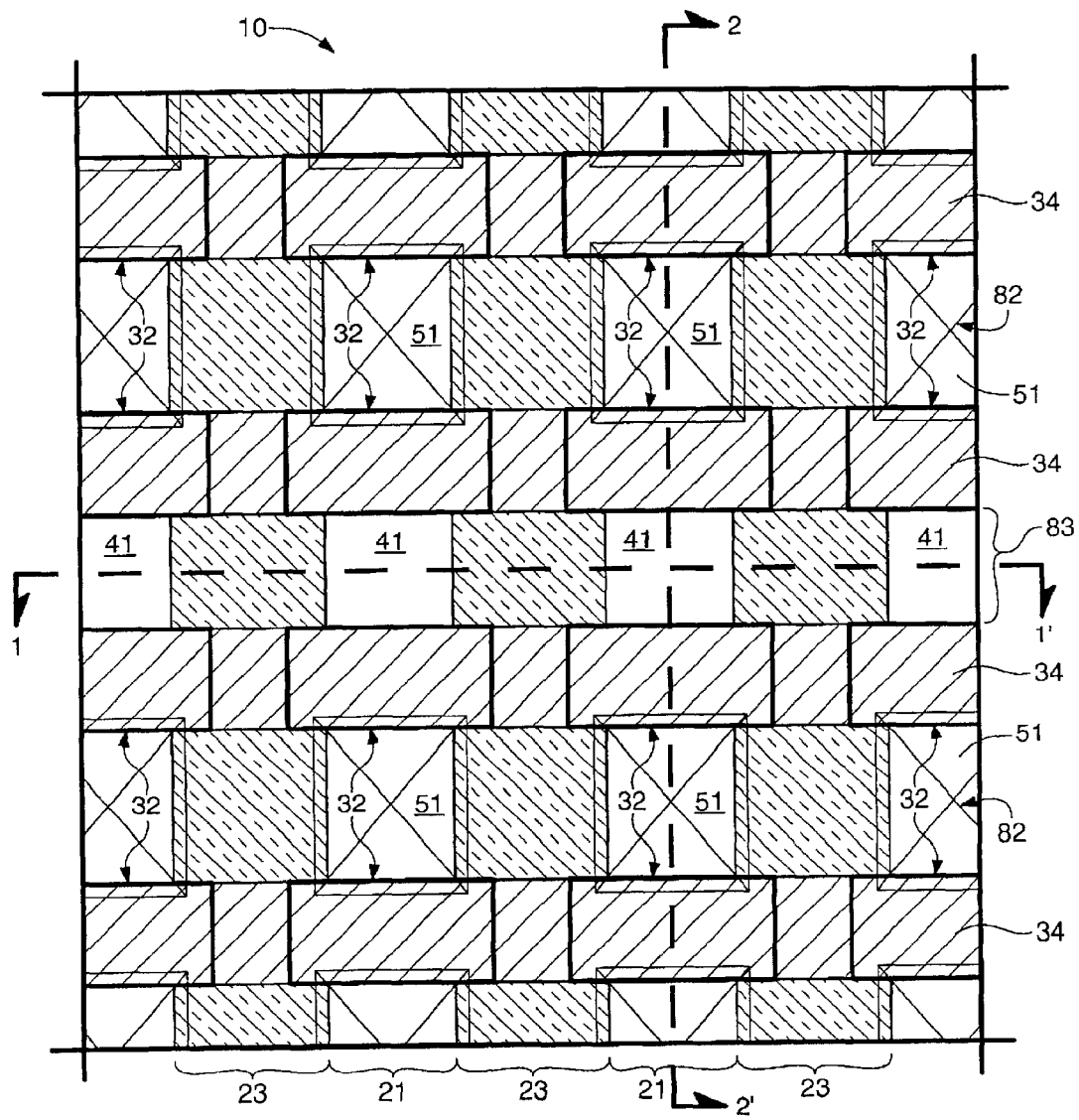
FIG. 1 is a top-down view depicting the layout of an array of flash cells, each cell utilizing a tungsten local interconnect-self aligned source (WLI-SAS flash cell).

Referring now to the top-down view of FIG. 1, the layout of a WLI-SAS flash cell on wafer substrate 10 is presented. Active areas 21 define the location of source, drain and channel of the floating gate devices to be formed. Shallow trench isolation 23 provides isolation between neighboring gate devices. Wordlines 34 run horizontally and overlie the floating gates 32. Floating gates 32 span between self-aligned sources and drains that reside in the confines of active areas 21. Self-aligned drain contacts 82 make contact to underlying drains 51 and tungsten local interconnects 83 make contact to underlying self-aligned sources 41.

Figure 2:
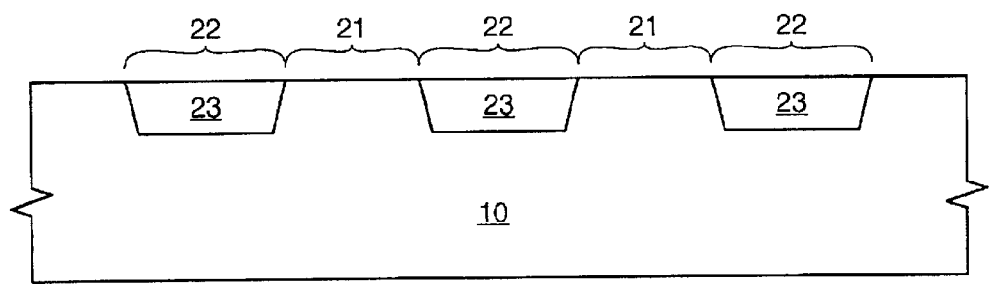
FIG. 2 is a cross-sectional view taken through line 1–1' of FIG. 1 after the definition of active areas and shallow trench isolation.

FIG. 2 is a cross-sectional view of FIG. 1 taken through line 1–1'. Referring now to FIG. 2, future source/drain regions 21 are defined, followed by the formation of shallow trench isolation. The shallow trench isolation is formed first by etching trenches 22 into substrate 10. Trenches 22 are then filled with oxide 23 that is then planarized.

Figure 3:
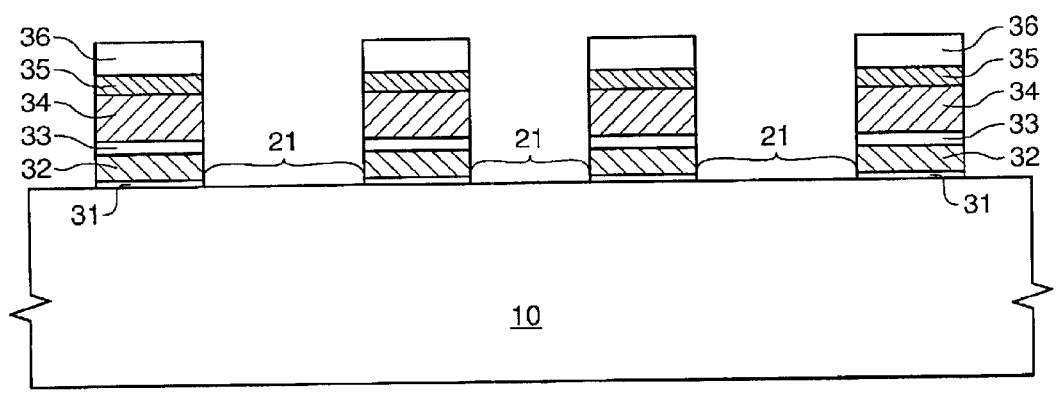
FIG. 3 is a cross-sectional view taken through line 2–2' of FIG. 1 after the formation of a transistor gate stack for a floating gate device.

FIG. 3 is a cross-sectional view of FIG. 1 taken through line 2–2'. Referring now to FIG. 3, various materials have been deposited and etched to form the transistor gate for each floating gate device. The transistor gate comprises tunnel oxide 31, a self-aligned floating gate 32, an inter-polysilicon dielectric (such as an oxide/nitride/oxide stack) 33, polysilicon wordline 34, which is typically capped with tungsten silicide 35 and dielectric cap 36, such as oxide or nitride. FIG. 3 also shows the locations of future source/drain regions 21.

Figure 4:
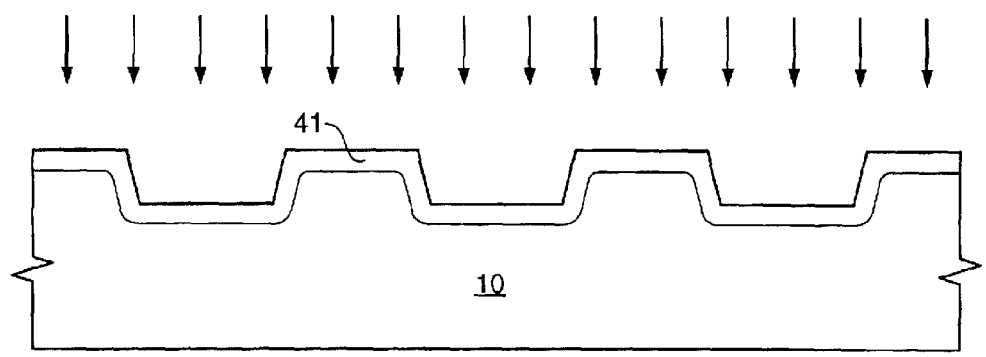
FIG. 4 is a cross-sectional view following the cross-sectional view of FIG. 2 taken after the removal of the shallow trench isolation oxide followed by a source implant and a blanket phosphorous and/or arsenic source/drain implant.
Figure 5:
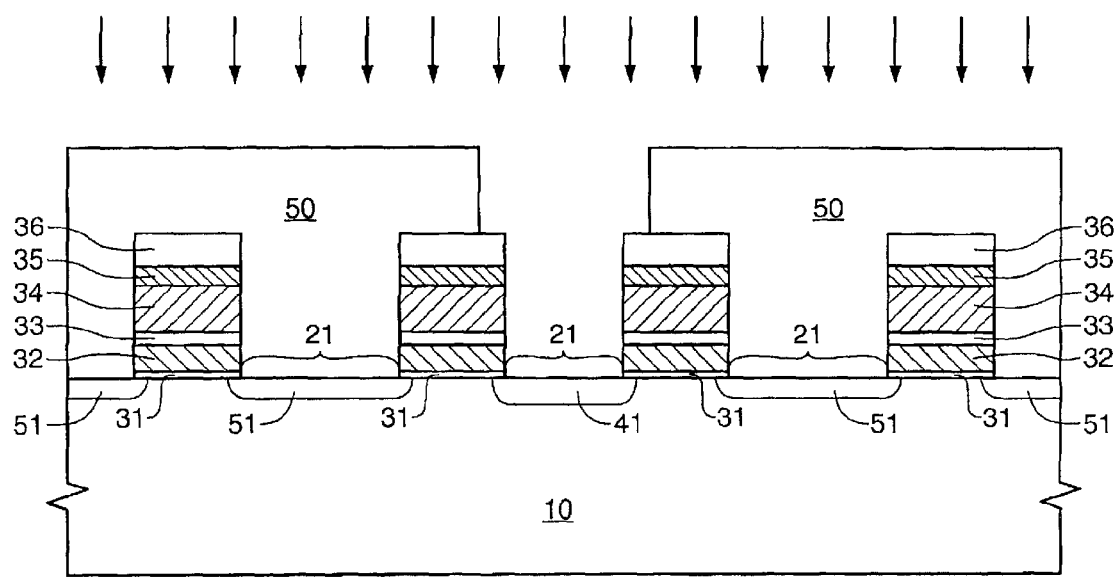
FIG. 5 is a cross-sectional view following the cross-sectional view of FIG. 3 taken after a phosphorous and/or arsenic source/drain implant.

FIG. 4 follows the view of FIG. 2, while FIG. 5 follows the view of FIG. 3. Referring now to FIG. 4, an etch is performed to remove shallow trench isolation oxide 23. Referring now to both FIGS. 4 and 5, photoresist 50 is patterned to expose a predetermined source region. Using photoresist as a mask, a source implant, typically using phosphorous and/or arsenic is performed to create self-aligned source region 41 (shown in both FIGS. 4 and 5). This source implant creates a source region that directly aligns itself to the transistor gate, thus the term self-aligned source. Next, photoresist 50 is stripped and a blanket source/drain implant (typically arsenic) is performed to form a deeper implanted self-aligned source region 41 and to form drain regions 51.

Figure 6:
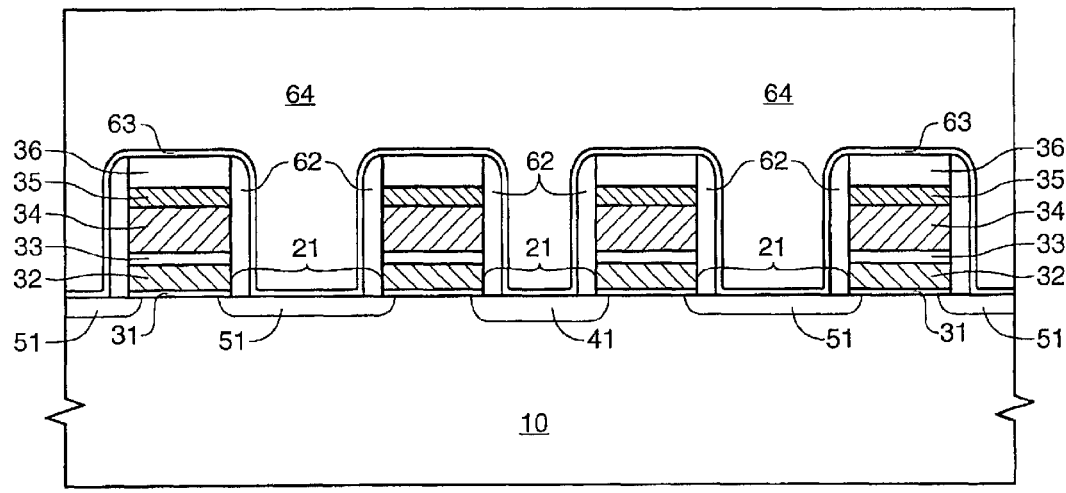
FIG. 6 is a cross-sectional view following the cross-sectional view of FIG. 5 taken after the formation of transistor gate cap and spacers, followed by the deposition of a conformal layer of nitride and the formation of a planarized borophosphosilicate glass (BPSG) isolation layer.

FIG. 6 follows the view of FIG. 5. Referring now to FIG. 6, transistor isolation spacers 62 are formed. The conventional floating gate process uses oxide to form spacers 62. In the present invention, nitride is used in order to take advantage of the better dielectric qualities nitride possesses compared to oxide. Even though nitride is known to exert more stress than will oxide on underlying structures and possibly cause electrical changes, nitride is an effective etch stop material to use during the subsequently performed self-aligned contact etch. Regardless if oxide or nitride is used to spacers 62, following the formation of spacers 62, a conformal nitride etch stop barrier layer 63 is deposited which will cover source/drain regions 41 and 51 as well as cap 61 and spacers 62. Then the structure is covered with the formation of BPSG material 64 that is planarized.

Figure 7:
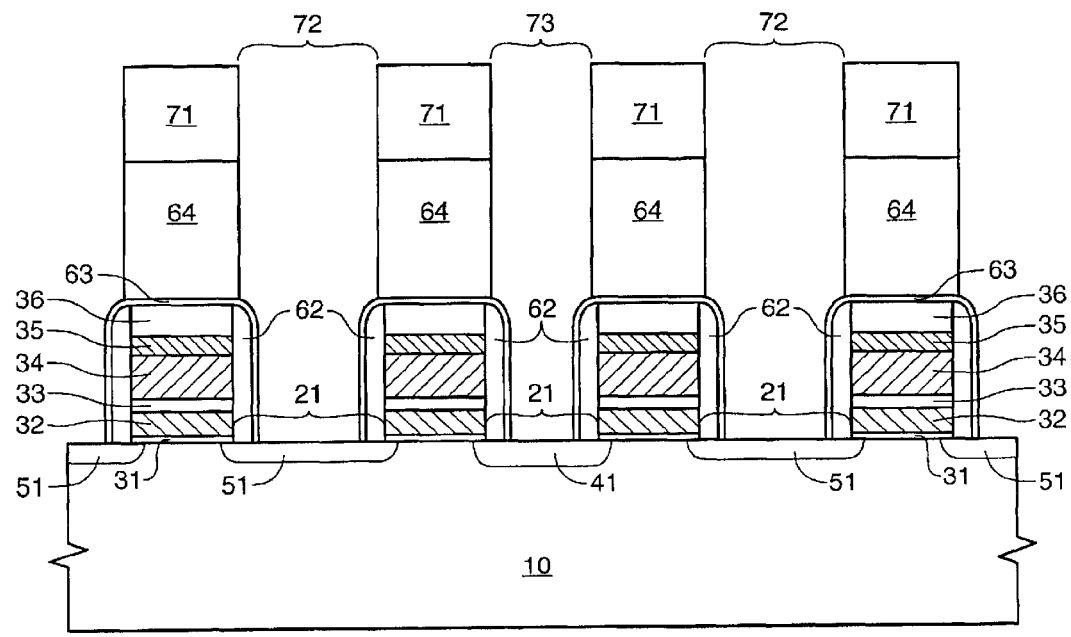
FIG. 7 is a cross-sectional view following the cross-sectional view of FIG. 6 taken after the patterning and etching of contact via opening to expose the source and drain of the floating gate device.

Referring now to FIG. 7, BPSG material 64 is patterned with photoresist 71 to allow for a subsequent via etch (also defined as the self-aligned source contact etch or SAS etch) to form drain contact via openings 72 and source line opening 73. The via etch removes exposed BPSG material 64 and stops on etch stop barrier layer 63. Next, an etch is performed to clear the conformal nitride from the surface of source/drain regions 41 and 51.

Figure 8:
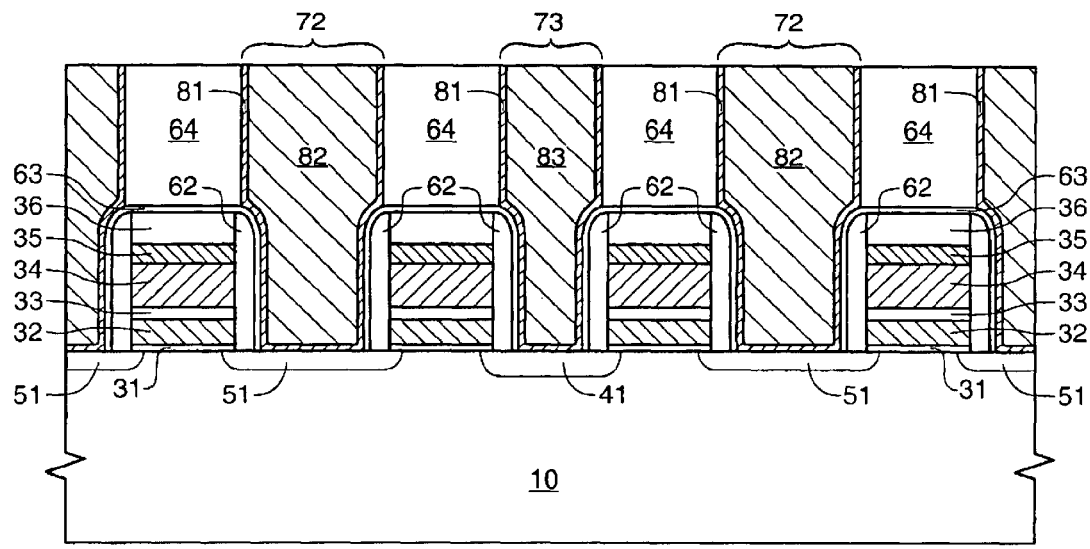
FIG. 8 is a cross-sectional view following the cross-sectional view of FIG. 7 taken after the formation of a planarized layer of tungsten to create drain contact plugs and to create a tungsten local interconnect between each source.

Referring now to FIG. 8, photoresist 71 (seen in FIG. 7) is stripped and a conformal titanium nitride barrier layer 81 is deposited along the edges of via openings 72 and 73. Next, a metal such as tungsten-based metal (solely tungsten or titanium tungsten) is formed to fill drain contact via openings 72 and source line opening 73. The metal is then planarized to form self-aligned drain contacts 82 (or plugs 82) and local interconnect 83 that is self-aligned to source 41. Drain contact plugs 82 will subsequently become connected between the drain of selected floating gate devices and a digit line.

Figure 9:
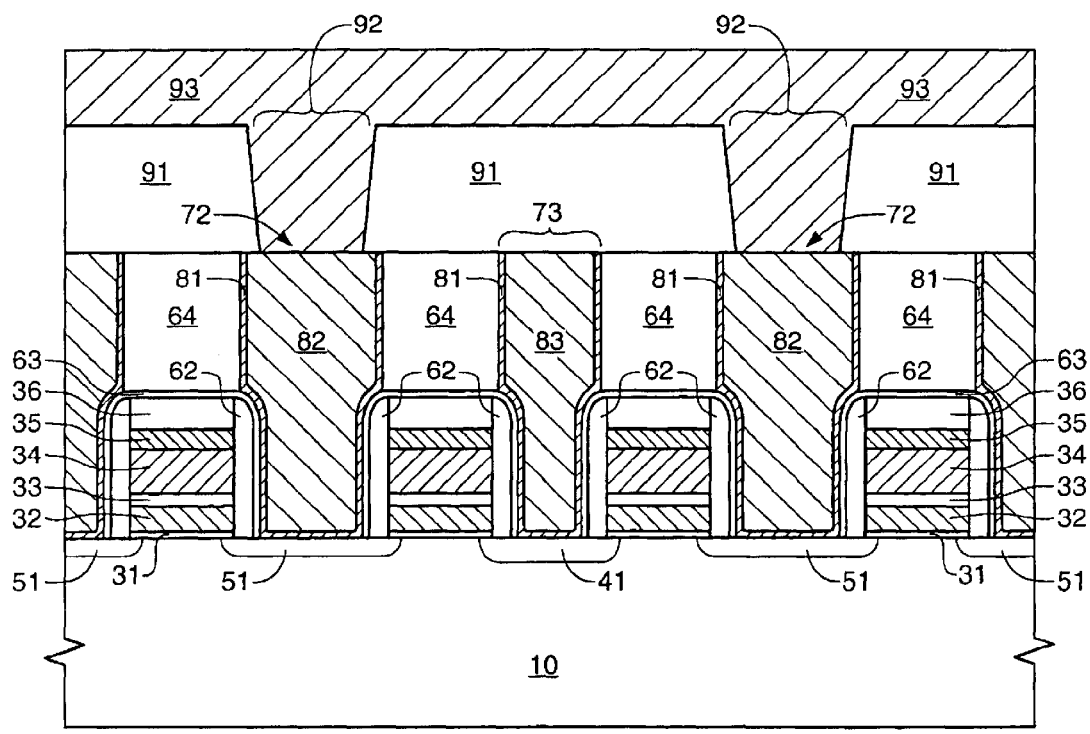
FIG. 9 is a cross-sectional view following the cross-sectional view of FIG. 8 taken after the formation of a planarized layer of inner layer dielectric material that is patterned and etched to provide via openings to expose the drain contact plugs which is followed by the formation of a planarized metal to make interconnect between the drain plugs.

Referring now to FIG. 9, an inner layer dielectric material 91 is formed over the present structure of FIG. 8. Dielectric material 91 is planarized and then patterned and etched to form via openings 92 that expose underlying drain contact plugs 81. Next a metal 93 is formed that fills via openings 92. Metal 93 is planarized and serves as a digit line for the selected floating gate devices.

Figure 10:
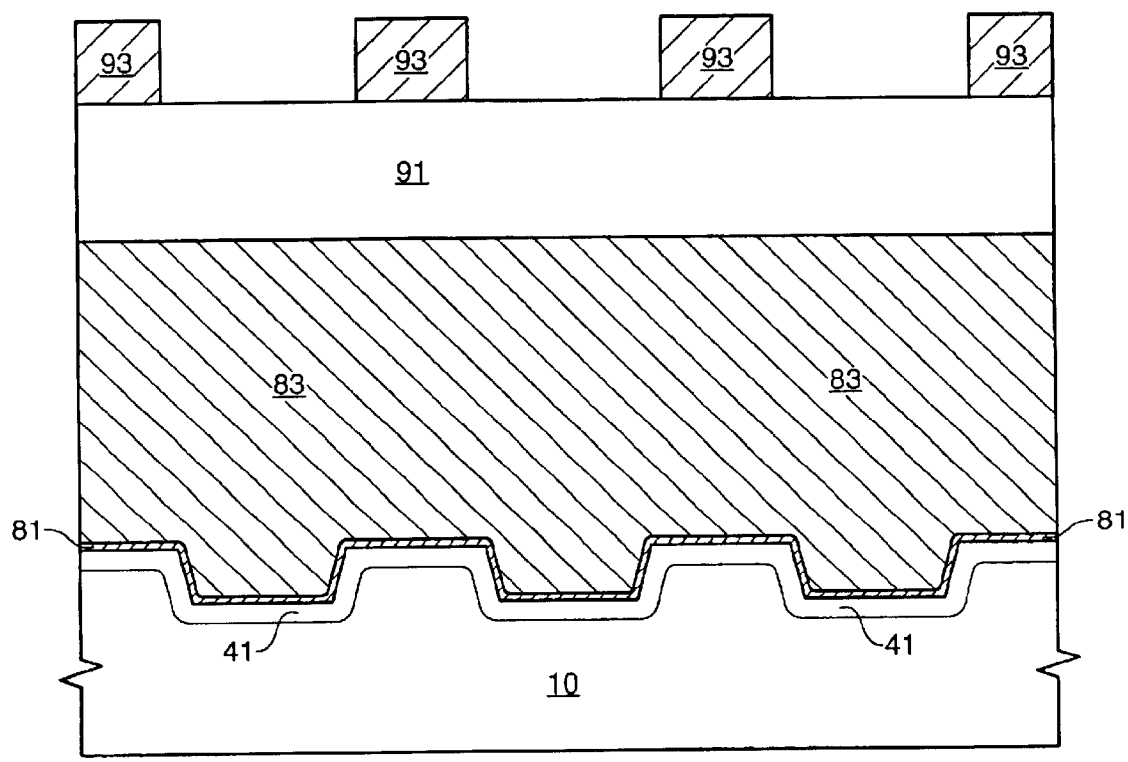
FIG. 10 is a cross-sectional view following the cross-sectional view of FIG. 5 taken after the formation of a planarized layer of tungsten to create a tungsten local interconnect between each source.

FIG. 10 is a cross-sectional view taken along the self-aligned source. Referring now to FIG. 10, local interconnect 83 makes connection to each source of a series of devices that are inner-connected by the self-aligned source implant. An important element of the present invention is the combination of metal local interconnect 83, with the self-aligned source 41, in conjunction with self-aligned drain contacts 82 (not seen in FIG. 10) that significantly lowers source resistance and also allows the fabrication of a smaller floating gate device. The self-aligned source allows for a smaller cell simply by its inherent nature of being self-aligned to the transistor gate of each floating gate device. The lowered source resistance, due to the presence of the metal local interconnect, gives better cell performance uniformity when comparing the performance of a cell that is relatively close to a source contact versus a cell fairly far away from a source contact. With the metal local interconnect, the overall size of the array can be reduced, as fewer source contacts will be needed compared to a conventional flash cell array. Most importantly, the metal local interconnect 83 connecting from source to source of series of devices will significantly reduce source resistance as the metal (such as a tungsten-based metal) provides a much better conducting line than does the conductively doped active area that forms the source for each device.

As demonstrated by the teachings of the present invention, the addition of the tungsten local interconnect to the self-aligned source electrode can be efficiently incorporated into conventional flash memory device fabrication methods.

It is to be understood that although the present invention has been described with reference to several preferred embodiments, various modifications, known to those skilled in the art, may be made to the process steps presented herein without departing from the invention as recited in the several claims appended hereto.

What is claimed is:

1. A method for forming a flash memory device in a semiconductor assembly, comprising the steps of:

forming a series of floating gate devices having their source electrodes connected together by a conductive implant into a defined active area, each source electrode being self-aligned to a respective gate electrode;

forming a metal interconnect running a major length of said connected together source electrodes, said metal interconnect making a substantially continuous contact therebetween and spanning completely between neighboring gate electrodes; and forming a metal drain plug for each floating gate device of said series of floating gate devices, said metal drain plug connecting between a drain electrode of each said floating gate device and a digit line.

2. The method of claim 1, wherein said step of forming a metal drain plug further comprises self-aligning said metal drain plug to a respective drain electrode.

3. A method for forming a flash memory device on a semiconductor assembly comprising forming a metal interconnect running a major length of a series of source electrodes connected together by a conductively doped active area, said source electrodes formed in a self-aligning manner to their respective gate electrodes, said metal interconnect having a majority of a bottom surface making contact to said conductively doped active area and spanning completely between neighboring gate electrodes.

4. A method for forming a flash memory device on a semiconductor assembly comprising the steps of:

forming a series of floating gate devices having their source electrodes connected together by a conductively doped active area, said source electrodes being self-aligned to their respective transistor gates of each said floating gate device;

forming a nitride barrier layer overlying each transistor gate;

forming a planarized insulation layer over said nitride barrier layer;

removing portions of said planarized insulation layer while using said nitride barrier layer to self-align an interconnect via to said source electrodes;

forming a metal interconnect into said interconnect via, said metal interconnect running a major length of said connected together source electrodes and making contact therebetween and spanning completely between neighboring gate electrodes; and forming a metal drain plug for each floating gate device of said series of floating gate devices, said metal drain plug self-aligned to and connected between a drain electrode of each said floating gate device and a digit line.

5. A method for forming a flash memory device in a semiconductor assembly, comprising the steps of:

forming a series of floating gate devices having their source electrodes connected together by a conductive implant into a defined active area, each source electrode being self-aligned to a respective gate electrode;

forming a metal interconnect running a major length of said connected together source electrodes, said metal interconnect making a substantially continuous contact therebetween and spanning completely between neighboring gate electrodes; and forming a metal drain plug for each floating gate device of said series of floating gate devices, said metal drain plug connecting between a drain electrode of each said floating gate device and a digit line.

6. The method of claim 5, wherein said step of forming a metal drain plug further comprises self-aligning said metal drain plug to a respective drain electrode.

7. A method for forming a flash memory device in a semiconductor assembly, comprising the steps of:

forming a series of floating gate devices having their source electrodes connected together by a conductive implant into a defined active area, each source electrode being self-aligned to a respective gate electrode;

forming a tungsten-based interconnect running a major length of said connected together source electrodes, said tungsten-based interconnect making a substantially continuous contact therebetween; and forming a tungsten-based drain plug for each floating gate device of said series of floating gate devices, said tungsten-based drain plug connecting between a drain electrode of each said floating gate device and a digit line.

8. The method of claim 7, wherein said step of forming a tungsten-based drain plug further comprises self-aligning said tungsten drain plug to a respective drain electrode.

9. A method for forming a flash memory device on a semiconductor assembly comprising forming a tungsten-based interconnect running a major length of a series of source electrodes connected together by a conductively doped active area, said source electrodes formed in a self-aligning manner to their respective gate electrodes, said tungsten-based interconnect having a majority of a bottom surface making contact to said conductively doped active area.

10. A method for forming a flash memory device on a semiconductor assembly comprising the steps of:

forming a series of floating gate devices having their source electrodes connected together by a conductively doped active area, said source electrodes being self-aligned to their respective transistor gates of each said floating gate device;

forming a nitride barrier layer overlying each transistor gate;

forming a planarized insulation layer over said nitride barrier layer;

removing portions of said planarized insulation layer while using said nitride barrier layer to self-align an interconnect via to said source electrodes;

forming a tungsten-based interconnect into said interconnect via, said tungsten-based interconnect running a major length of said source electrodes and making contact therebetween; and forming a tungsten-based drain plug for each floating gate device of said series of floating gate devices, said tungsten-based drain plug self-aligned to and connected between a drain electrode of each said floating gate device and a digit line.

11. A method for forming a flash memory device in a semiconductor assembly, comprising the steps of:

forming a series of floating gate devices having their source electrodes connected together by a conductive implant into a defined active area, each source electrode being self-aligned to a respective gate electrode;

forming a metal interconnect consisting of a metal nitride barrier layer and an overlying metal layer, said metal interconnect running a major length of said connected together source electrodes, said metal interconnect making a substantially continuous contact therebetween; and forming a metal drain plug for each floating gate device of said series of floating gate devices, said metal drain plug connecting between a drain electrode of each said floating gate device and a digit line.

* * * * *